United States Patent
Elasser et al.

(10) Patent No.: US 6,239,466 B1
(45) Date of Patent: May 29, 2001

(54) INSULATED GATE BIPOLAR TRANSISTOR FOR ZERO-VOLTAGE SWITCHING

(75) Inventors: Ahmed Elasser, Latham; Michael Joseph Schutten, Schenectady, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/205,310

(22) Filed: Dec. 4, 1998

(51) Int. Cl.[7] .................. H01L 29/739; H01L 29/745
(52) U.S. Cl. .................. 257/341; 257/139; 257/131; 257/156
(58) Field of Search .................. 257/131, 139, 257/156, 341

(56) References Cited

U.S. PATENT DOCUMENTS

| | | |
|---|---|---|
| 4,620,211 | 10/1986 | Baliga et al. . |
| 4,855,799 | * 8/1989 | Tanake .................. 257/131 |
| 4,982,258 | * 1/1991 | Baliga .................. 257/156 |
| 5,572,048 | * 11/1996 | Sugawara .................. 257/139 |
| 5,714,775 | * 2/1998 | Iuoue .................. 257/139 |

FOREIGN PATENT DOCUMENTS

| | | |
|---|---|---|
| 0 779 662 | 6/1997 | (EP) . |
| 2 559 958 | 8/1997 | (FR) . |
| 62-298120A | 12/1987 | (JP) . |
| 1-090561A | 7/1989 | (JP) . |
| WO 98 43287 | 1/1998 | (JP) . |

OTHER PUBLICATIONS

"The Auxiliary Resonant Commutated Pole Converter," FW DeDoncker, JP Lyons; IEEE 1990, pp. 1228–1235.

"A Summary of Resonant Snubber Circuits for Transistors and GTOS, " D. Tardiff, TH Barton, IEEE 1989, pp.1176–1180.

"The Resonant DC Link Converter–A New Comcept in Static Power Conversion, " DM Divan, IEEE 1986, pp.648–656.

"Zero–Switching–Loss Inverters for High–Power Applications, " DM Divan, IEEE Transactions on Industry Applications, vol. 25, No. 4, 1989, pp. 634–643.

"Zero–Voltage Switching in High Frequency Power Converters Using Pulse Width Modulation, " CP Henze, HC Martin, DW Parsley, IEEE 1988, pp. 33–40.

"Switching Losses of IGBTs Under Zero–Voltage and Zero–Current Switching, " A. Elasser, MJ Schutten, V. Vlatkovic, DA Torrey, MH Kheraluwala, IEEE 1996, pp. 600–607.

"IGBT Turn–Off Losses for Hard Switching and with Capacitive Snubbers, " A. Pettertieg, J. Lode, TM Undeland, IEEE 1991, pp. 1501–1507.

"Switching Dynamics of IGBT's in Soft–Switching Converters, " I Widjaja, A. Kurnia, K. Shenai, DM Divan, IEEE 1995, pp. 445–454.

"Switching Loss Analysis of Shorted Drain Non Punch––Through and Punch–Through Type IGBTs in Voltage Resonant Circuit, " N. Iwamuro, Y. Hoshi, Y. Seki, N. Kumagai, IEEE 1991, pp. 220–225.

* cited by examiner

Primary Examiner—Jerome Jackson, Jr.
(74) Attorney, Agent, or Firm—Jill M. Breedlove; Douglas E. Stoner

(57) ABSTRACT

An IGBT is optimized for ZVS operation, thereby significantly reducing switching losses during ZVS operation. In effect, the IGBT is optimized to operate as a MOSFET with a very small bipolar transistor component. Switching losses are reduced by reducing the number of minority carriers injected into the device during conduction. Additionally, this ZVS IGBT structure allows for a small increase in stored charge as the operating temperature is increased, allowing the device to operate at higher temperatures with relatively low switching losses.

3 Claims, 6 Drawing Sheets

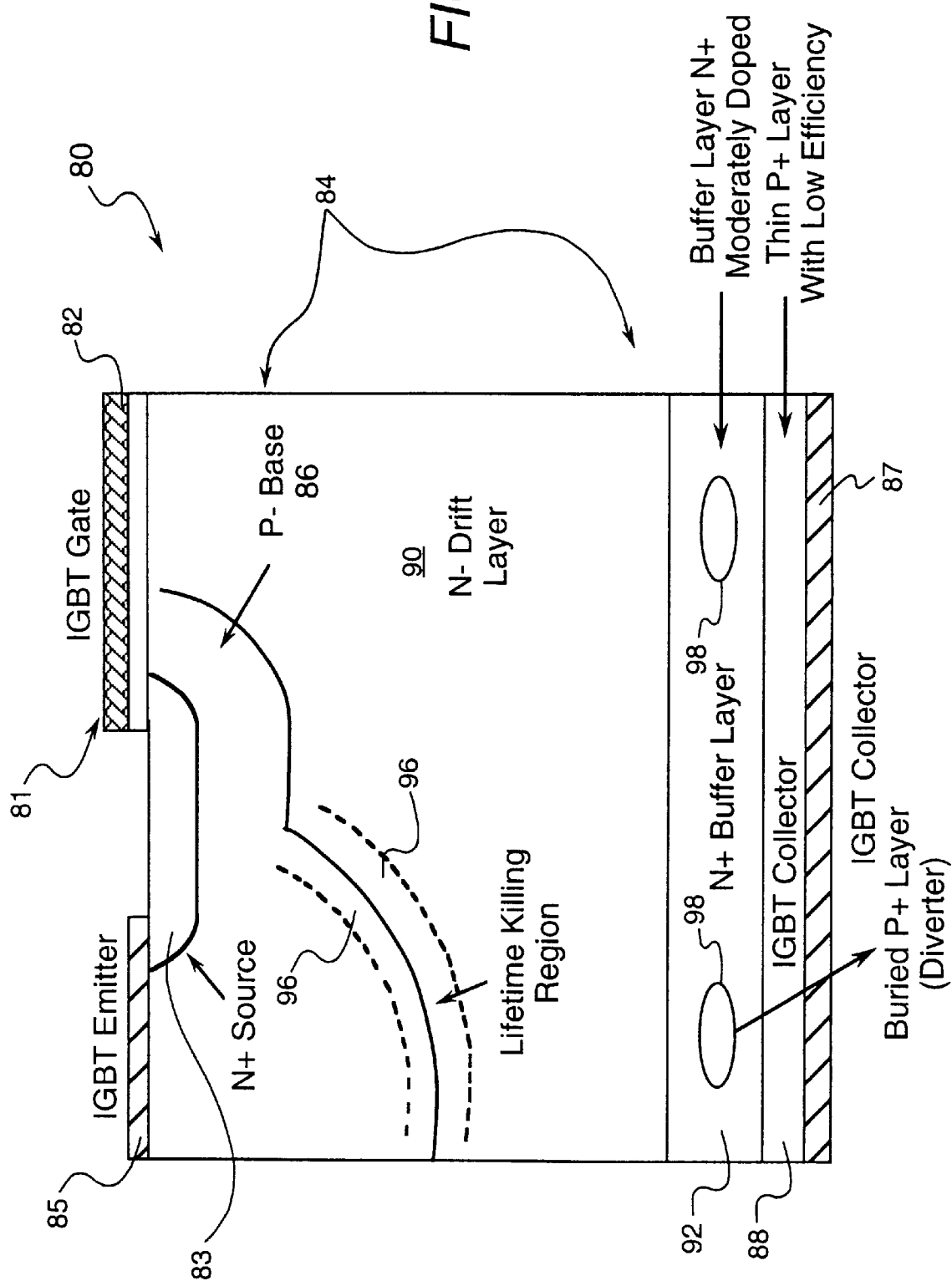

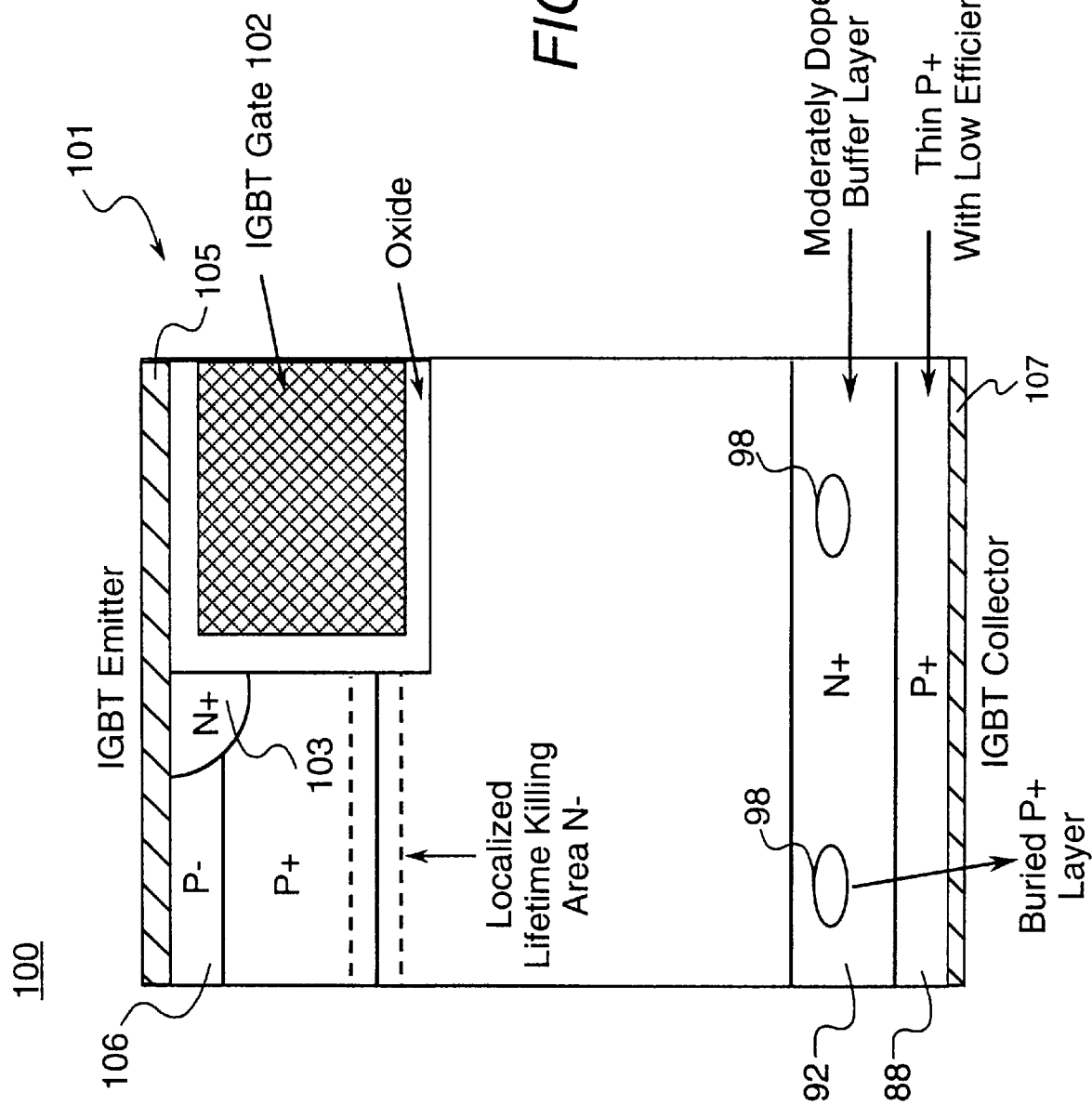

INSULATED GATE BIPOLAR TRANSISTOR FOR ZERO-VOLTAGE SWITCHING

BACKGROUND OF THE INVENTION

The present invention relates generally to semiconductor switching devices and, more particularly, to insulated gate bipolar transistors (IGBT's) optimized for zero-voltage switching (ZVS).

Presently available IGBT's are typically of two types, i.e., punch-through (PT) and non-punch-through (NPT). PT IGBT's typically use "lifetime killers" to maximize the trade-off between turn-off time and forward voltage drop. (Lifetime killers are known in the art as comprising external elements which are injected into silicon in order to reduce its lifetime.) NPT IGBT's typically use a thin P+ collector layer in order to reduce the number of charges injected into the drift layer. PT IGBT's have a buffer layer that acts as a minority carrier injection limiter and allows for a reduction in the thickness of the drift layer. Basically, the buffer layer acts as a barrier to the minority carriers and also allows the electric field in the device to stop at its edge, thereby increasing the voltage/length ratio. Hence, for a given voltage, e.g., 600 V, a PT IGBT with a buffer layer would require approximately 60–80 µm of silicon to block the voltage, while an NPT IGBT without the buffer layer would require 100–120 µm of silicon to block the same voltage.

Both PT and NPT IGBT's are optimized for hard-switching operation. However, ZVS (zero-voltage switching, i.e., switching with zero voltage across a device) results in significant operational advantages, particularly in converter applications, over hard-switching at high switching frequencies. Advantages include significantly reduced switching losses, higher switching frequency operation, low electromagnetic interference, lower device voltage and current stresses, better safe operating area, and low-cost thermal management system.

Accordingly, it is desirable to provide an IGBT structure which is optimized for ZVS operation and applications.

BRIEF SUMMARY OF THE INVENTION

An IGBT is optimized for ZVS operation, thereby significantly reducing switching losses during ZVS operation. In effect, the ZVS IGBT is optimized to operate as a MOSFET with a very small bipolar junction transistor (BJT) component. Switching losses are reduced by reducing the number of minority carriers injected into the device during conduction. Additionally, this ZVS IGBT structure allows for a small increase in stored charge as the operating temperature is increased, allowing the device to operate at higher temperatures with relatively low switching losses.

The ZVS IGBT has a very thin P+ collector layer with a very low emitter efficiency, i.e., ratio of hole current in the base to total emitter current. The doping of the P+ IGBT collector is designed to reduce the forward voltage drop of the IGBT without increasing the total charge stored in its drift layer. A relatively thin buffer layer is included in order to allow a reduction in thickness of the drift layer, also reducing the forward voltage drop. The thickness and doping of the buffer layer are tailored to allow only the number of minority carriers needed for conductivity modulation.

No lifetime killers are provided in the body of the drift layer, but only at the edge of the P+/N− BJT collector interface such that recombination of more minority carriers occurs while the voltage is still low, thereby reducing switching losses. The ZVS IGBT is structured such that, at low temperatures, back injection of holes during turn-off from the P+ collector of the IGBT's PNP bipolar transistor allows some of the minority carriers to be swept out toward the P+ collector of the IGBT, reducing the magnitude of the current tail. The gain of the ZVS IGBT's PNP bipolar transistor is reduced in order to realize the advantages of back injection at higher temperatures. In addition, carefully placed P+ diverters are used to further reduce the number of stored minority carriers stored in the drift layer. Advantageously, at high switching frequencies, the size of a snubber capacitor needed to achieve ZVS with this optimized ZVS IGBT structure is significantly reduced, and moreover, may comprise the device's own parasitic capacitance for some applications.

BRIEF DESCRIPTION OF THE DRAWINGS

FIG. 8 illustrates a ZVS IGBT structure in accordance with preferred embodiments of the present invention;

FIG. 9 illustrates an alternative embodiment of a ZVS IGBT structure in accordance with preferred embodiments of the present invention.

DETAILED DESCRIPTION OF THE INVENTION

Figure 1:
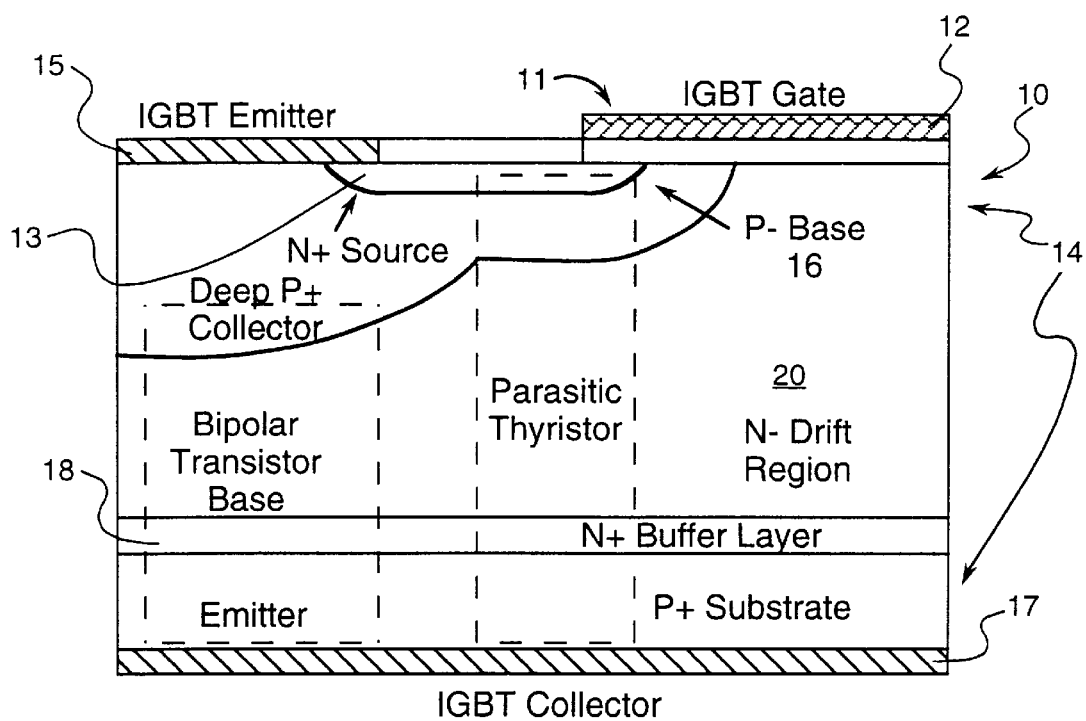
FIG. 1 illustrates a typical PT IGBT structure.

FIG. 1 illustrates a typical PT IGBT structure 10 comprising a MOSFET portion 11, including a gate 12 and a source 13; and comprising a bipolar transistor portion 14, including an emitter 15, a base 16 and a collector 17. PT IGBT 10 also includes a buffer layer 18 which acts as a minority carrier injection limiter and allows a small portion of a drift region (or layer) 20 thickness to be used for a given voltage. The PT IGBT's use lifetime killers in order to maximize the trade-off between turn-off time and forward voltage drop.

Figure 2:
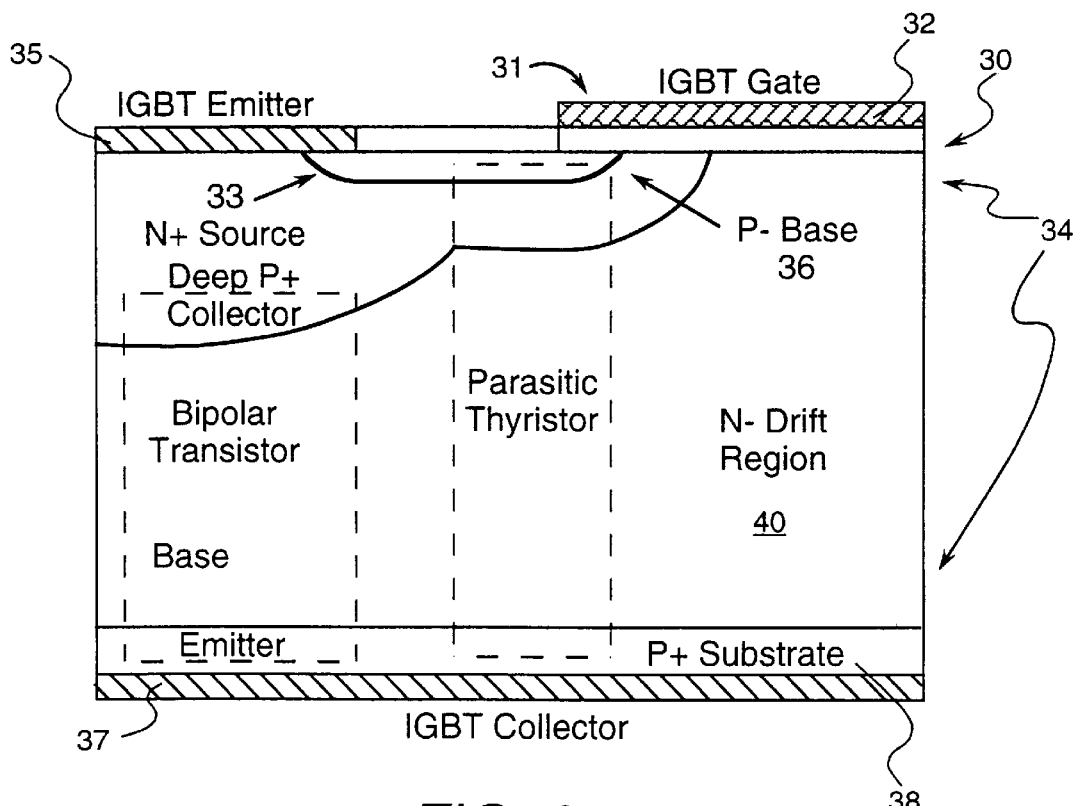
FIG. 2 illustrates a typical NPT IGBT structure.

FIG. 2 illustrates a typical NPT IGBT structure 30 comprising a MOSFET portion 31, including a gate 32 and a source 33; and comprising a bipolar transistor portion 34, including an emitter 35, a base 36 and a collector 37. As shown, the NPT IGBT has a thin P+ collector layer 38 for reducing the number of charges injected into the drift layer 40.

Figure 3:
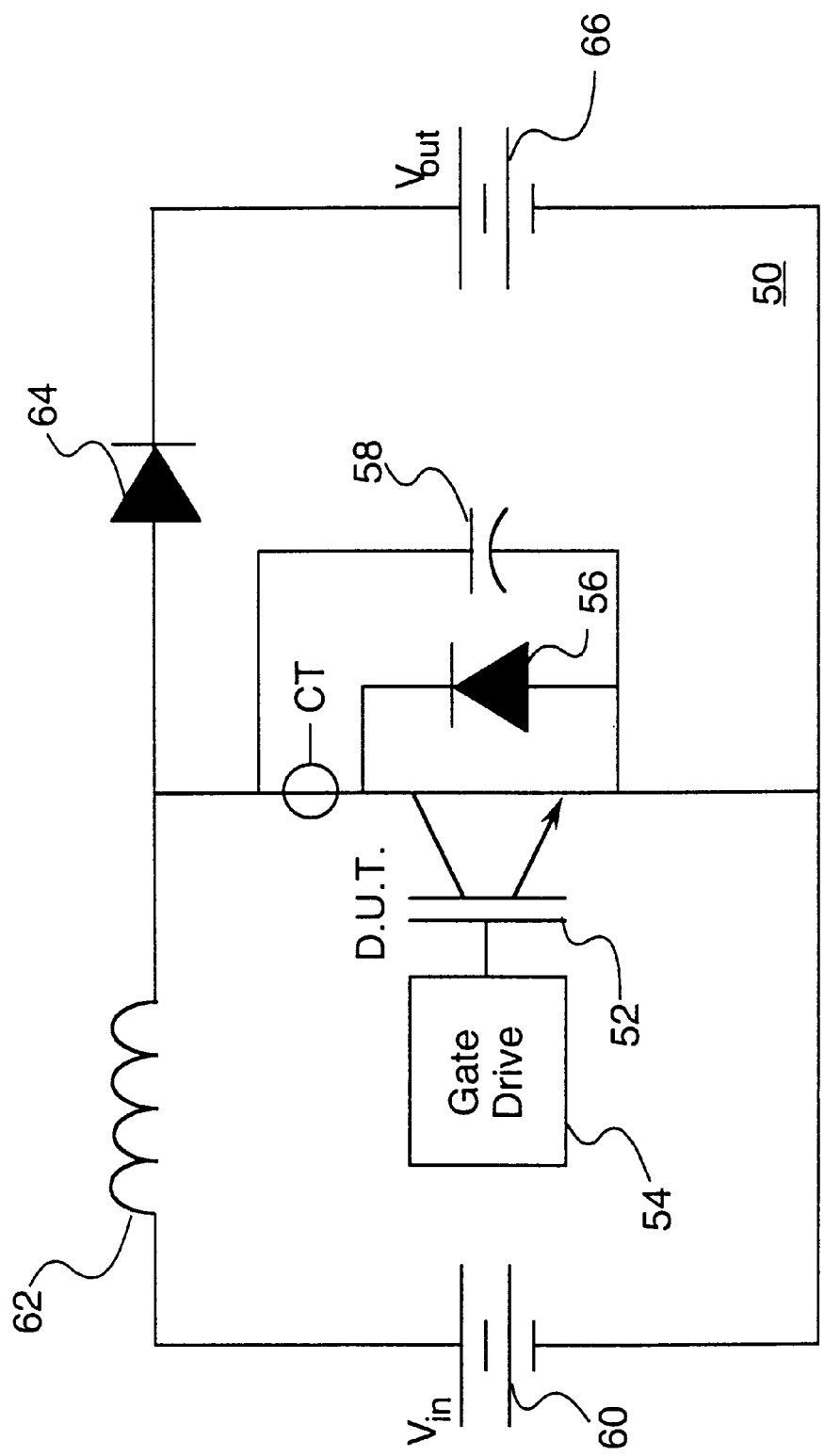
FIG. 3 schematically illustrates a ZVS test set-up.

FIG. 3 illustrates a test set-up 50 employed for testing commercially available PT and NPT IGBT's under ZVS conditions and for testing new IGBT structures in accordance with preferred embodiments of the present invention. The device under test (DUT) is indicated by the numeral 52, and it is shown as being coupled to a gate drive 54 for driving the device. Additionally, the device under test is connected in parallel with a diode 56 and a capacitor (C) 58. An input dc voltage supply Vin is represented by the numeral 60 and is coupled in series with an input inductor 62, the other terminal of which is connected to the collector of the device under test. The anode of a diode 64 is also connected to the collector of the device under test, the cathode of the diode 64 being connected to an output dc supply (Vout) 66.

Figure 4:
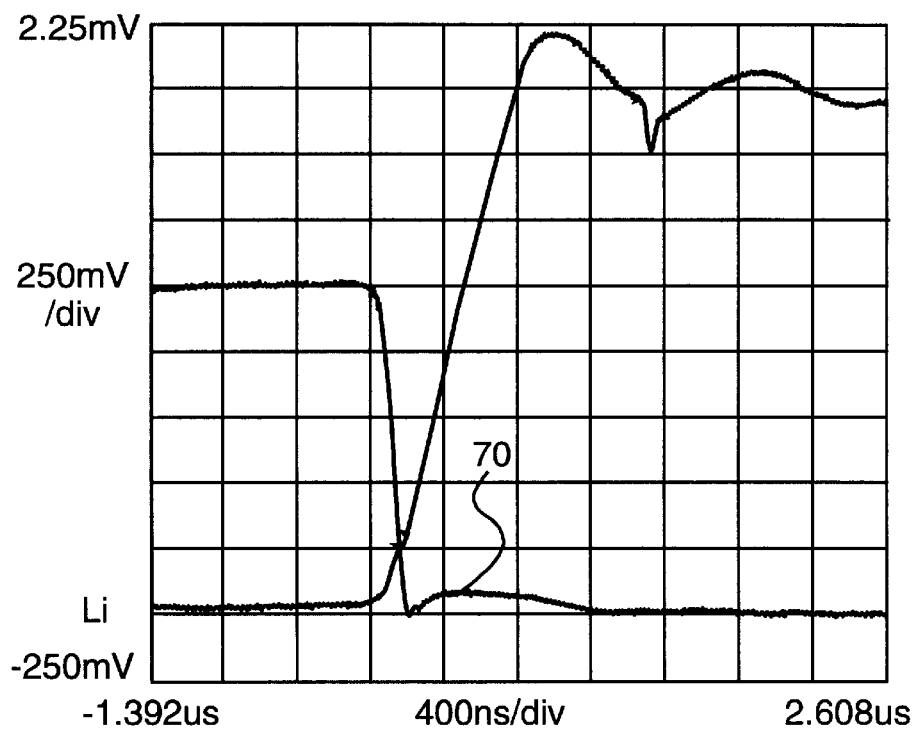
FIGS. 4 and 5 graphically illustrate NPT and PT switching waveforms, respectively.
Figure 5:
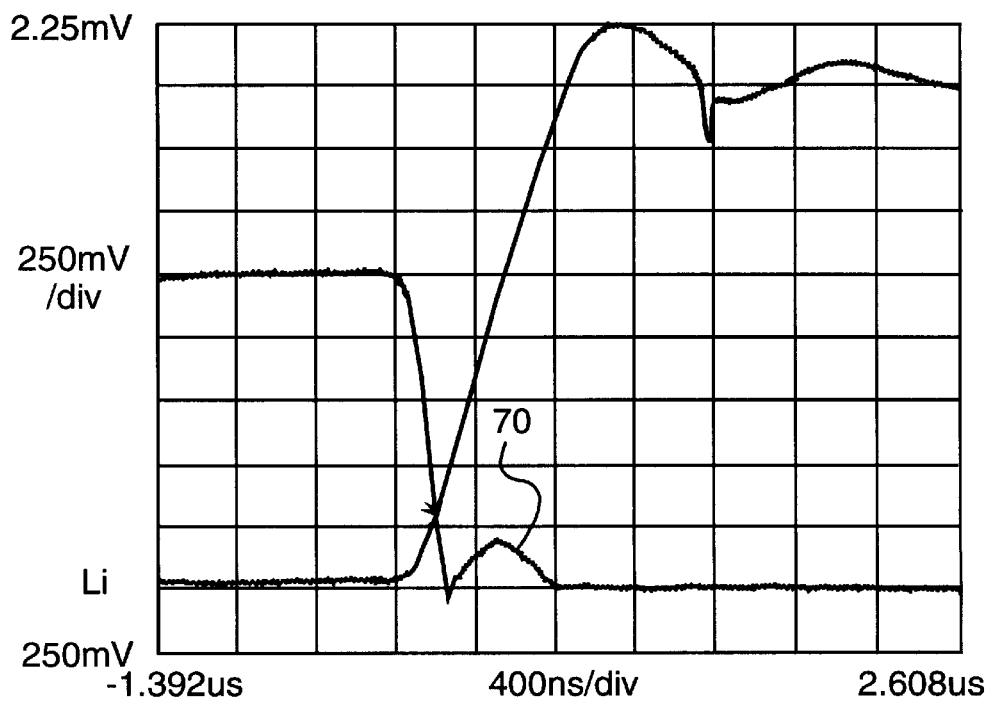

FIGS. 4 and 5 illustrate switching loss waveforms (voltage Vd and current Id) for commercially available NPT and PT IGBT's, respectively, using the test set-up of FIG. 3 at 800V, 1000 A, temperature of 75° C., and a snubber capacitor value C=0.94 μF. As illustrated, under ZVS conditions, these devices exhibit a current tail 70 at device turn-off. The current tail is due to the high level of minority carriers injected into the drift layer. For PT IGBT's, the number of minority carriers increases with temperature; e.g., losses increase by a factor of three when temperature is varied from 25° C. to 125° C. The increase is not as significant for NPT IGBT's, but losses are high at 25° C., for example. For either type of device, losses are generally high and would cause significant power losses at high switching frequencies, e.g., 20–100 kHz.

From testing, features of presently available commercial PT and NPT IGBT's are as follows:

(1) Both PT and NPT IGBT's exhibit high turn-off switching losses at elevated junction temperatures, e.g., 75° C.–125° C.

(2) Although PT IGBT's have relatively low switching losses at low junction temperatures, switching losses increase significantly at higher junction temperatures;

(3) Switching losses are largely due to charge stored in the device during conduction as represented by:

$$Q_s = \frac{L^2 I_o}{2D_p}\left(1 - \frac{1}{\cosh\left(\frac{W}{L}\right)}\right)$$

The total charge $Q_s$ is dependent on the load current $I_o$, the carrier lifetime, and the drift layer thickness W.

(4) ZVS is more favorable in terms of lower switching losses to PT IGBT's than to NPT IGBT's;

(5) An increase in snubber capacitor value C does not lead to a substantial reduction in switching losses for NPT IGBT's;

(6) Although NPT IGBT's have a very low emitter efficiency, the thick drift layer offsets this advantage and consequently leads to high losses;

(7) NPT IGBT's have higher switching losses at low temperatures, e.g., 25° C.–75° C. The losses are primarily due to the current tail which is larger than that for its PT counterpart;

(8) The MOSFET component of current in PT IGBT's decreases with temperature, leading to an increase in the bipolar component of current. The bipolar component of current is responsible for the high switching losses at device turn-off.

Figure 6:
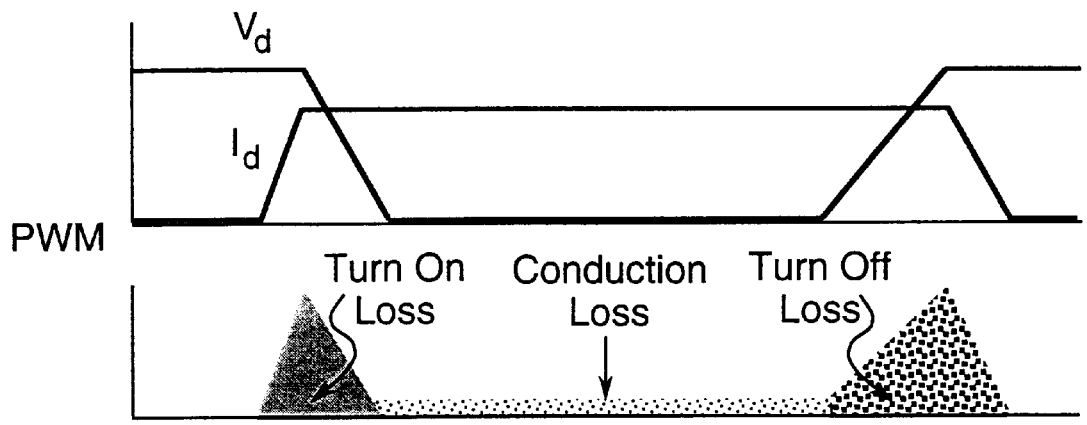
FIGS. 6 and 7 graphically illustrate hard-switched and ZVS waveforms, respectively, for an IGBT PT structure such as that of FIG. 1.

FIGS. 6 shows typical waveforms for hard-switching IGBT operation for a PT IGBT structure, such as illustrated in FIG. 1. Vd represents the voltage across the device, and Id represents the current through the device during switching events, i.e., turn-on and turn-off. FIG. 6 also shows the switching power loss which is the product of voltage and current. As illustrated, the turn-on and turn-off losses are substantial due to the overlapping of voltage and current during switching.

Figure 7:
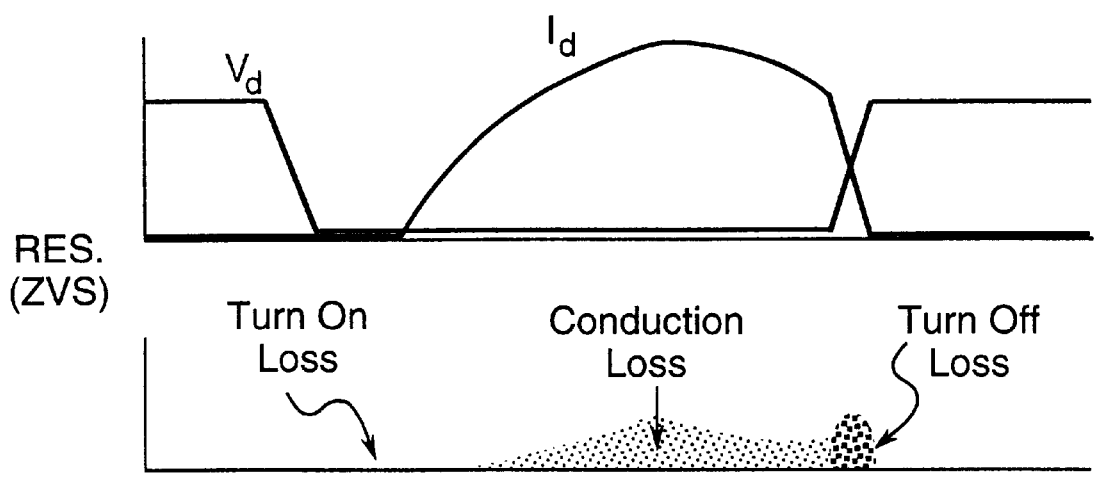

FIG. 7 shows the voltage and current waveforms for a PT IGBT structure, such as illustrated in FIG. 1, under ZVS operation. The turn-off losses are low, and there are no turn-on losses. In particular, the device turns on at zero-voltage, hence there are no turn-on losses. The device turns off with a slowly rising voltage; hence, there is a small overlap between voltage and current, resulting in low power losses. Conduction losses are slightly higher for ZVS operation due to an increase in current.

FIG. 8 illustrates a ZVS IGBT 80 in accordance with preferred embodiments of the present invention comprising a MOSFET portion 81, including a gate 82 and a source 83; and comprising a bipolar transistor portion 84, including an emitter 85, a base 86 and a collector. The gate structure of ZVS IGBT 80 is illustrated as comprising a DMOS gate structure. IGBT 80 has a thin P+ collector layer 88 with low efficiency, similar to that of the NPT type device, for reducing the number of charges injected into drift layer 90. However, unlike both NPT and PT structures, the doping of the P+ collector layer 88 is tailored to reduce the forward drop of the IGBT without increasing the total number of stored charges in the drift layer. A buffer layer 92 is provided to reduce the thickness of the drift layer. Unlike currently available PT IGBT's wherein the buffer layer is thick and heavily doped, the buffer layer of the IGBT 80 is thin and moderately doped.

For example, for a 600V IGBT, the drift layer thickness may be between approximately 55 μm–70 μm. For an NPT IGBT with similar device ratings, the drift layer thickness may be between approximately 100–120 μm. Exemplary layer thicknesses in power devices may range from 40 μm (thin) to 600 μm (thick).

Lifetime killers are not used across the entire drift layer of a ZVS IGBT according to preferred embodiments of the present invention. Rather, lifetime killers are localized in a region 96 at the edge of the P+/N− interface of the IGBT's PNP bipolar transistor component. With ZVS, the voltage is controlled by the snubber capacitor C across the device (FIG. 3). By introducing some deficiencies in the structure at the P+/N− interface of the IGBT's PNP bipolar junction, more recombination of minority carriers occurs while the voltage is still low, resulting in low switching losses. By the time the voltage across the device reaches the bus voltage Vin, most of the carriers will have either recombined in a lossless manner or will have been swept out (i.e., removed) by the increasing depletion layer to the IGBT collector.

At relatively low temperatures and during ZVS, back-injection of holes during turn-off from the P+ collector of the IGBT's PNP bipolar junction allows some of the minority carriers to be swept out toward the P+ collector of the IGBT, thereby reducing the magnitude of the current tail. This phenomenon disappears at high temperatures. However, in the optimized structure, since lifetime killers are not used across the whole drift layer, back-injection at high temperatures is achieved by increasing the gain of the IGBT's PNP bipolar transistor.

The number of minority carriers in the drift layer is reduced further through the IGBT's parasitic NPN bipolar transistor. In particular, during hard-switching, minority carriers are swept out, i.e., removed, from the P− base by increasing the collector-emitter voltage, but in ZVS, the voltage across the device increases slowly. Therefore, it is not possible to quickly sweep out the minority carriers from the device.

The number of stored minority carriers is also reduced by using carefully placed P+ diverters. In particular, two P+ regions (i.e., P+ diverters) 98 are buried in the N+ buffer layer in order to facilitate the removal of excess minority carriers. During the turn-on phase when minority carriers are injected into the drift layer, the P+ diverter regions act as a trap for some of the minority carriers injected from the IGBT's P+ collector. At turn-off, the diverter regions act as PNP bipolar transistors. The current in these regions increases the magnitude of the negative current at turn-off, thus forcing the back injection of holes toward the IGBT's P+ collector.

At high switching frequencies, the size of the snubber capacitor C (FIG. 3) needed to achieve ZVS is considerably reduced. Preferably, an optimized IGBT according to the present invention uses its own parasitic capacitance to achieve ZVS. To this end, the IGBT is optimized to effectively operate as a MOSFET with a very small bipolar component.

FIG. 9 illustrates an alternative embodiment of a ZVS IGBT 100 wherein a trench gate structure 102 is employed instead of the DMOS gate structure of FIG. 8. ZVS IGBT 100 comprises a MOSFET portion 101, including trench gate 102 and a source 103; and comprising a bipolar transistor portion 104 including an emitter 105, a base 106 and a collector 107. Under ZVS, the IGBT's are turned on at zero-voltage. At high di/dt, an initial high forward drop is observed due to conductivity modulation lag; that is, injection lags the increase in current. To avoid this phenomenon, fast injection of holes is needed, which may be achieved by either reducing the doping concentration of the IGBT's P+ collector or by adding more P+ diverter regions 98. (Conductivity modulation is a process of injecting a large amount of electrons and holes into a drift layer (with a background doping of electrons and hole), the injected electrons and holes overwhelming the background doping and helping to reduce the resistance of the intrinsic drift layer region dramatically, allowing for small forward voltage drop and high current densities.)

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An IGBT suitable for ZVS operation, comprising:

a MOSFET portion comprising a gate, a source and an IGBT collector; and a BJT portion comprising an emitter, a base, and a BJT collector;

the gate, source, base and emitter being situated on one side of the IGBT opposite to another side having the IGBT collector situated thereon with an N− drift layer situated therebetween;

the IGBT collector comprising a P+ layer which is relatively thin with respect to the thickness of the drift layer, the P+ layer being doped in a predetermined amount such as to minimize forward voltage drop without substantially increasing total charge stored in the drift layer;

an N+ buffer layer situated between the P+ layer and the drift layer, the buffer layer being relatively thin with respect to the drift layer;

the drift layer having localized lifetime killers at the edge of the P+/N− BJT collector interface, no lifetime killers being situated in the interior of the drift layer beyond the edge thereof; and P+ diverter regions situated at predetermined locations in the N+ buffer layers for reducing a number of minority carriers stored in the N− drift layer at both turn on and turn off of the IGBT.

2. The IGBT of claim 1 wherein the gate comprises a DMOS gate structure.

3. The IGBT of claim 1 wherein the gate comprises a trench gate structure.

* * * * *